(12) United States Patent
Maston, III et al.

(10) Patent No.: US 6,264,037 B1
(45) Date of Patent: Jul. 24, 2001

(54) TRAY FOR BALL GRID ARRAY INTEGRATED CIRCUIT

(75) Inventors: Roy E. Maston, III; Robert H. Murphy, both of Merrimack, NH (US)

(73) Assignee: R. H. Murphy Co., Inc., Amherst, NH (US)

( * ) Notice: Subject to any disclaimer, the term of this patent is extended or adjusted under 35 U.S.C. 154(b) by 0 days.

(21) Appl. No.: 09/559,770

(22) Filed: Apr. 27, 2000

(51) Int. Cl.$^7$ ................................................. B65D 73/02
(52) U.S. Cl. ............................................ 206/725; 206/726
(58) Field of Search ............................ 206/718, 722–728, 206/706, 560, 564

(56) References Cited

U.S. PATENT DOCUMENTS

| | | | |
|---|---|---|---|
| 5,109,981 | * 5/1992 | Maston, III et al. ................ | 206/724 |
| 5,167,326 | * 12/1992 | Murphy ............................... | 206/724 |
| 5,335,771 | * 8/1994 | Murphy ............................... | 206/725 |
| 5,400,904 | 3/1995 | Maston, III et al. . | |
| 5,551,572 | 9/1996 | Nemoto . | |
| 5,673,795 | 10/1997 | Clatanoff et al. . | |
| 5,746,319 | * 5/1998 | Murphy ............................... | 206/725 |
| 5,890,599 | * 4/1999 | Murphy ............................... | 206/725 |
| 6,116,427 | * 9/2000 | Wu et al. ............................. | 206/722 |

* cited by examiner

*Primary Examiner*—Luan K. Bui
(74) *Attorney, Agent, or Firm*—Pearson & Pearson, LLP

(57) ABSTRACT

A tray for ball grid array integrated circuits includes a storage pocket with a transverse structure. The transverse structure carries a plurality of columnar structures at spaced positions on and extending normally from the surface of the transverse structure. Each columnar support structure includes parallel columns that terminate in coplanar free ends that engage the terminal surface of one ball grid array integrated circuit to support it in a terminals down position within the storage pocket.

18 Claims, 5 Drawing Sheets

TRAY FOR BALL GRID ARRAY INTEGRATED CIRCUIT

BACKGROUND OF THE INVENTION

1. Field of the Invention

This invention generally relates to ball grid array (BGA) integrated circuits and more specifically to trays for the storage and transport of such BGA integrated circuits.

2. Description of Related Art

The storage and transportation of semiconductor components, such as BGA integrated circuits are important considerations in the production of electronic assemblies. Trays for the transport and storage of individual types of integrated circuits have emerged as important complementary products. Such trays have become popular because each tray can carry a plurality of integrated circuits and each tray can be stacked with other trays. A set of stack trays constitute an efficient means for shipping large numbers of individual integrated circuits. As these trays have grown in popularity, certain functional requirements have been defined. For example, trays must provide a direct, repeatable position correlation between the tray and the terminals on the integrated circuit. Trays must protect terminals from damage due to mechanical shock during transport. They must also prevent damage due to the accumulation of electrostatic charges.

Historically the semiconductor industry has developed a number of different integrated circuit packages. These packages have included, among others, TSOP, QFP, and PGA packages. Trays have been designed for those specific packages. The same development has occurred with respect to BGA integrated circuits, and there are a number of commercially available trays for such devices. For example, U.S. Pat. No. 5,400,904, assigned to the same assignee as this invention, discloses one such BGA tray. An outer frame defines discrete storage pocket areas. Inwardly facing tab surfaces extending from the framework in each pocket area define a first support plane for engaging the component in a first, or terminals down, orientation by engaging the periphery of the BGA integrated circuit adjacent an outer band of terminals. Second inwardly facing tab surfaces in each storage pocket area engage the other side of the BGA integrated circuit to support it in a terminals up position when the tray is inverted to a second orientation. Opposite offset wall portions on each side of the tray stabilize the component in the housing plane in either orientation. The offset allows these opposite extending wall portions to interfit when trays are stacked.

U.S. Pat. No. 5,551,572 (1996) to Nemoto discloses another version of a BGA tray. In this tray the structure that supports the BGA integrated circuit component in a terminals down position includes a peripheral edge formed in the storage pocket area. The edges are formed to partially surround the peripheral solder terminals thereby to increase the supporting surface for the BGA integrated circuit component.

When trays according to the foregoing patents were developed, the terminals were spaced from the edge of the integrated circuit. This defined a predetermined peripheral area for support. Now, however, as BGA integrated circuit manufacturers seek to increase the density of integrated circuit terminals in part, they are minimizing the free surface about the periphery of the device. It has become difficult to adapt the existing tray structures for these densely populated integrated circuits to provide a reliable support for BGA integrated circuits without damaging the outer terminal balls.

SUMMARY

Therefore it is an object of this invention to provide a tray for reliably carrying and transporting BGA integrated circuits.

Another object of this invention is to provide a more reliable structure for supporting a BGA integrated circuit in a terminals down position.

Still another object of this invention is to provide a tray for supporting all types of BGA integrated circuits more reliably in a terminals down position.

In accordance with one aspect of this invention, a tray for a ball grid array integrated circuit includes a storage pocket area for receiving an integrated circuit. The storage pocket area comprises a structure extending transversely across the storage pocket area and a plurality of columnar supports at spaced positions on and extending normally from the transversely extending structure. The columnar supports extend to coplanar free ends whereby the free ends of the columnar supports engage and support the terminal surface of the ball grid array integrated circuit within the storage pocket area in a terminals down position.

In accordance with another aspect of this invention a tray is adapted for receiving a plurality of ball grid array integrated circuits wherein each integrated circuit has a planar terminal side populated with a plurality of terminals having a predetermined pitch. The tray comprises a framework that defines a plurality of storage pocket areas, each pocket area being adapted to receive one integrated circuit. A plurality of platforms spaced within the storage pocket area attach to the framework. A plurality of spaced thin column structures extend from each spaced platform. The column structures terminate in coplanar free ends and the column structures at a given platform correspond to the predetermined pitch of the integrated circuit component terminals. Consequently the free ends engage the terminal side of the ball grid array integrated circuit in a terminals down position.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numerals refer to like parts, and in which:

DESCRIPTION OF ILLUSTRATIVE EMBODIMENTS

Figure 1A:
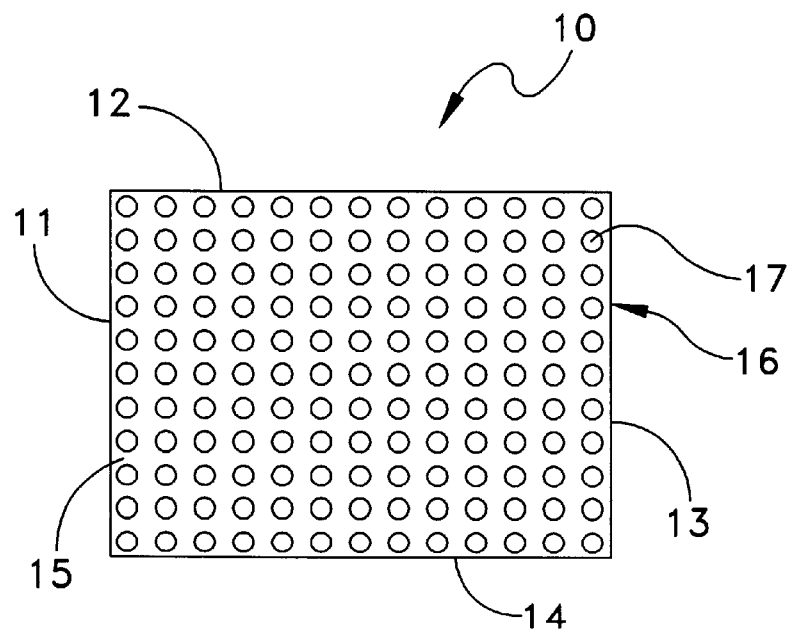
FIGS. 1A and 1B are plan views of a typical ball grid array integrated circuit component.
Figure 1B:
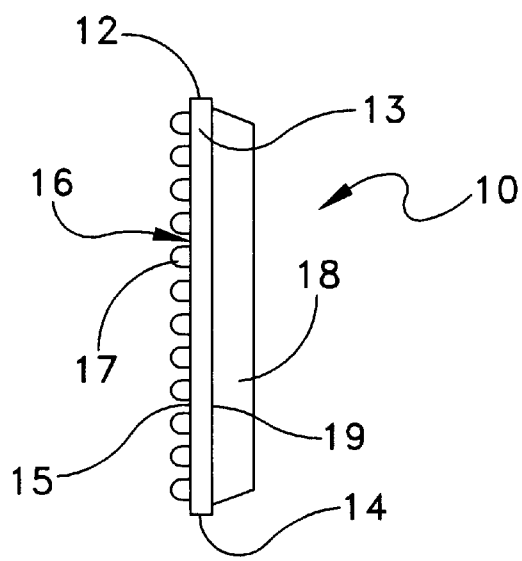

Referring to FIGS. 1A and 1B, an integrated circuit 10 has a generally rectangular shape bounded by peripheral edges 11 through 14. The BGA integrated circuit 10 additionally includes a planar terminal side 15 of a substrate 16 that contains a closely spaced array of solder ball terminals 17. Generally each integrated circuit will contain an encapsulated body 18 that extends from a second surface 19 of the substrate 16. The exact structure and internal connections of such BGA integrated circuits 10 are well known in the art and the details of such structures are not important to this invention. FIGS. 1A and 1B depict a rectangular ball grid array circuit having different length and width dimensions in the view of FIG. 1A. As known, integrated circuit packages may also have the square outlines.

Figure 2:
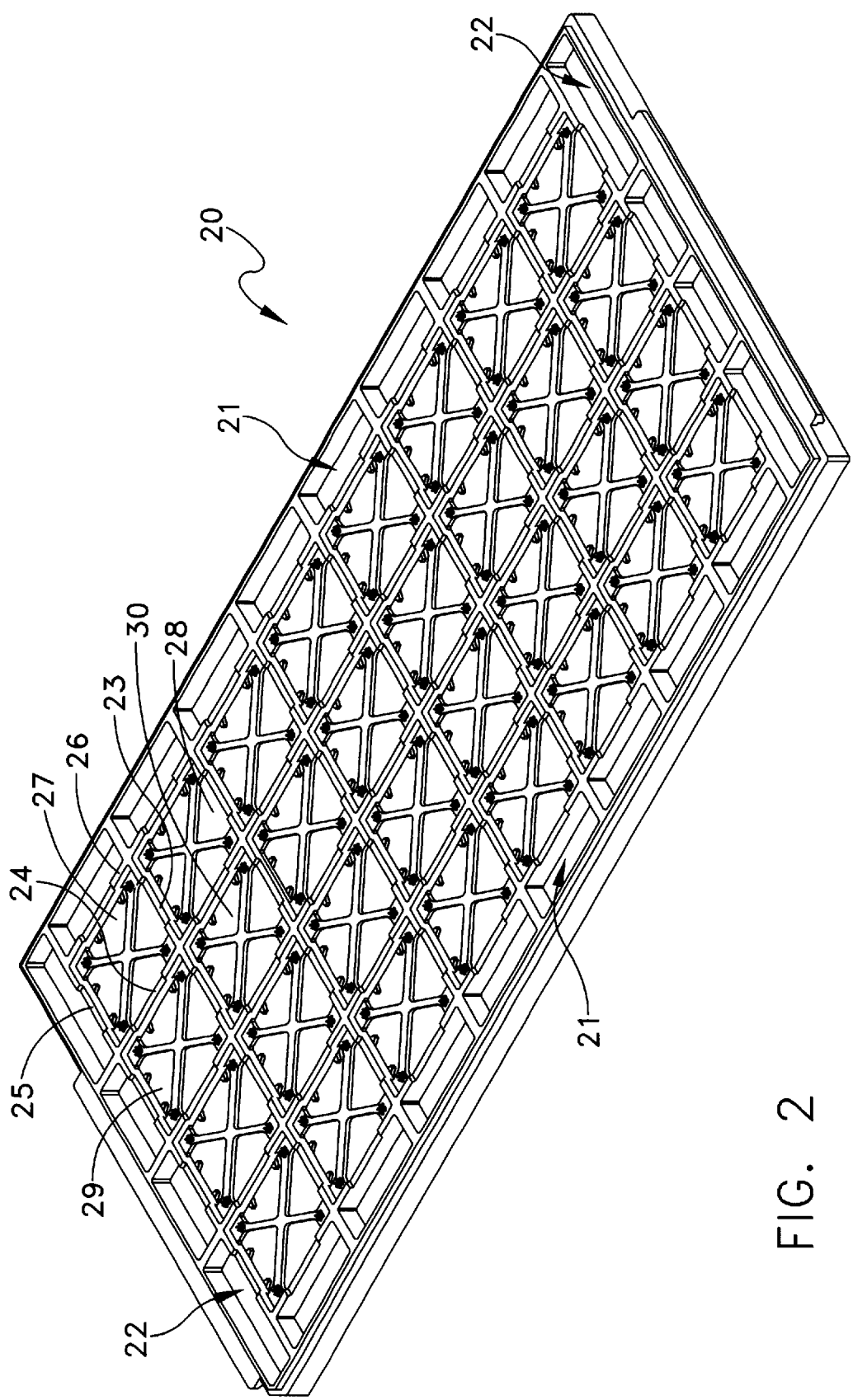
FIG. 2 is a perspective view of a tray for transporting a ball grid array integrated circuit components as shown in FIGS. 1A and 1B.

FIG. 2 depicts a molded plastic tray 20 adapted for receiving a plurality of rectangular BGA integrated circuit components. The tray 20 is constructed in accordance with JEDEC standards that define the dimensions of outer side frame portions 21 and end frame portions 22. These standards also control the location of additional walls 23 through 26 that form the periphery of different storage pocket areas, such as storage pockets 27 through 30.

In this particular embodiment each storage pocket has an identical structure. Other trays may, for manufacturing and other reasons independent of this invention, may exhibit variations in the structure of different storage pocket areas within an individual tray. Certain characteristics are common. For example, the wall 23 forms a boundary between the storage pockets 27 and the adjacent storage pocket 28. Likewise the wall 24 forms a boundary between the storage pocket 27 and a storage pocket 29, and the walls of the storage pockets 28 and 29 form common boundaries with the storage pocket 30.

Each tray is designed for a BGA integrated circuit of a particular size. In this example the tray 20 is designed with 32 storage pockets to carry 25×32 mm BGA integrated circuits. A larger number of storage pockets would be provided when BGA integrated circuits are smaller; conversely, a tray would have fewer storage pockets for larger BGA integrated circuits.

Figure 3:
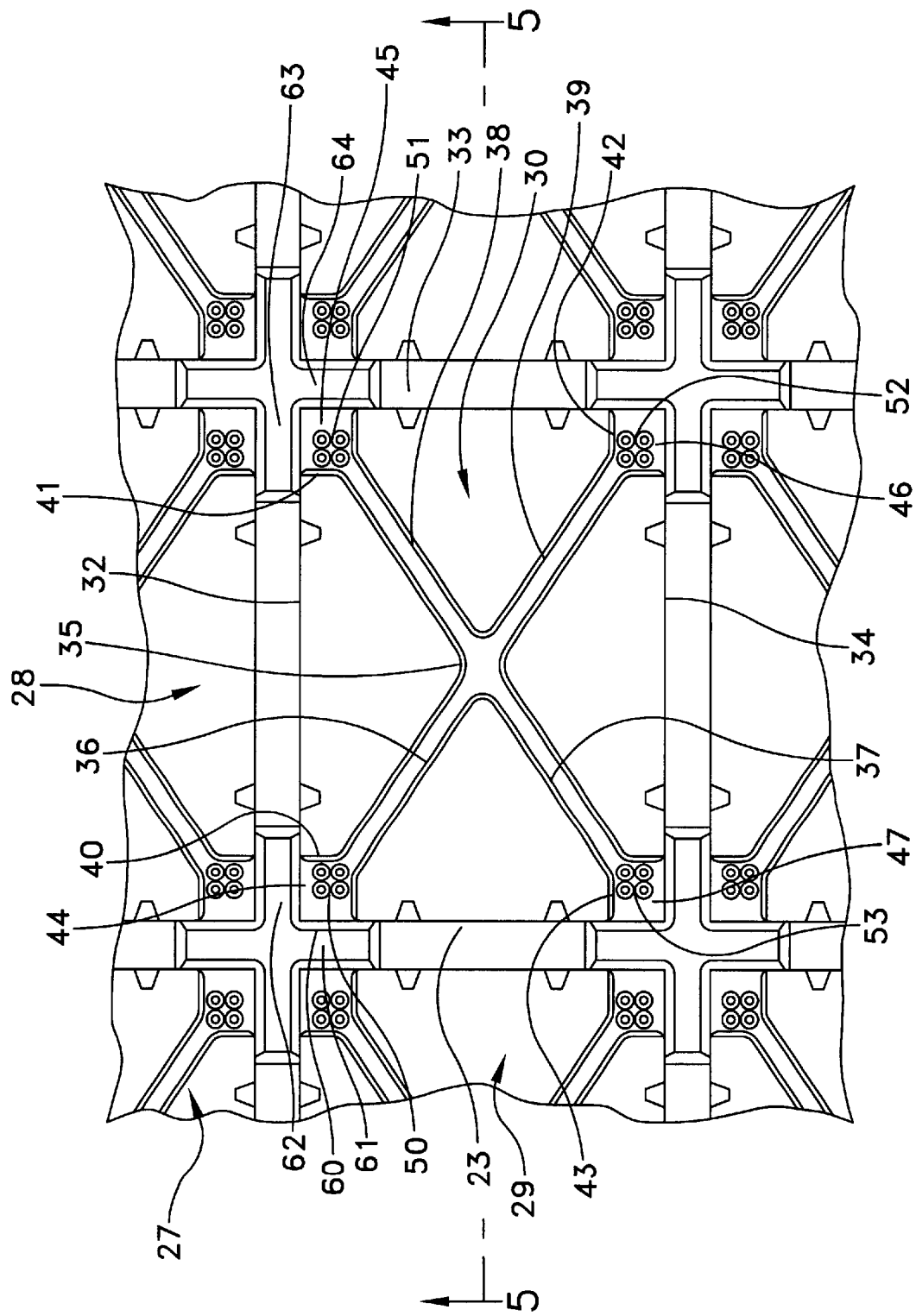
FIG. 3 is a detailed plan view of a storage pocket area in the tray of FIG. 2.

This invention is particularly directed to the construction of the individual storage pockets and is most clearly understood by referring to FIG. 3 that depicts the details of the storage pocket 30 and its relationship with adjacent storage pockets including storage pockets 27, 28 and 29. Each storage pocket, such as the storage pocket 30, includes an integrally molded transverse structure between the boundary walls of the storage pocket area. In FIG. 3 this structure 35 includes arms 36, 37, 38 and 39 that form a generally X structure.

Each arm extends from a central portion to an outer platform proximate a corner of the storage pocket. For example, platform 40 is formed at the corner that is common to the storage pockets 27, 28 and 29. Platform 41 is proximate the other corner adjacent the storage pocket 28. Platform 42 is positioned diagonally with respect to platform 40; and platform 43, diagonally with respect to platform 41.

In this particular embodiment, the platforms 40 through 43 define planar surfaces 44 through 47, respectively. Each platform carries a plurality or clusters of integrally molded spaced, thin column structures or clusters that terminate in coplanar free ends. Referring specifically to FIG. 3, the platforms 40 through 43 support column structures or clusters 50 through 53, respectively.

Figure 4:
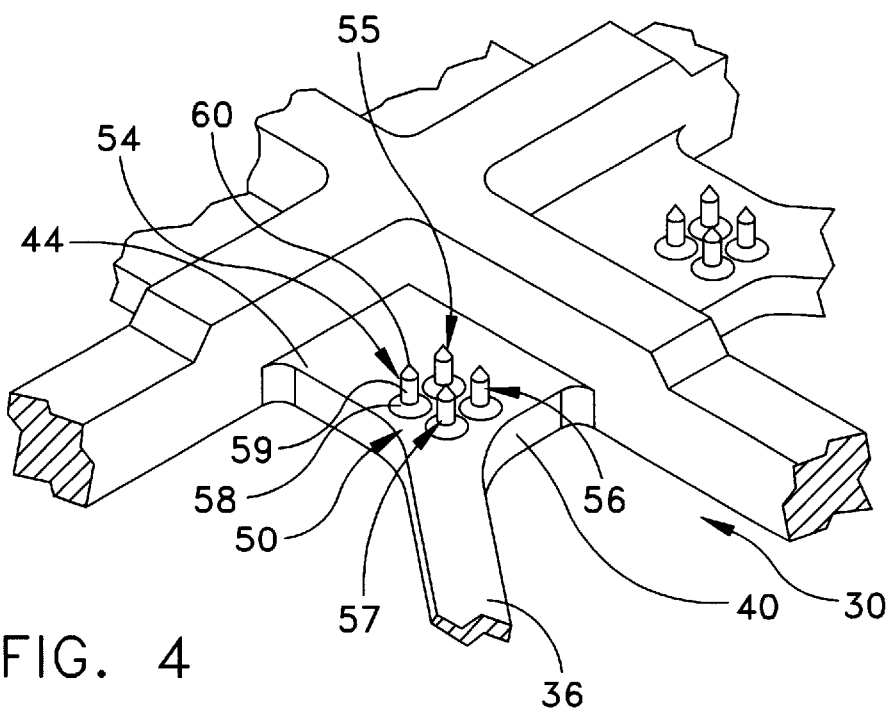
FIG. 4 is a detailed perspective view of a detailed columnar structures as shown in FIG. 3.

FIG. 4 depicts one specific column structure 50 on the platform 40 extending from the surface 44. In this particular embodiment, the column structure or cluster 50 comprises four columnar supports 54 through 57. Each columnar support, such as the columnar support 54, has a generally circular cross-section and includes a conically shaped base 58 and a tapered column 59 that extends normally to the platform from the base 58 to an upper free end 60. The free ends of all the columnar supports in the column structure 50 are coplanar with each other. They are also coplanar with the free ends of the columnar supports in the column structures 51 through 53. Consequently they define a first support plane for carrying a BGA integrated circuit component in a terminals down orientation.

Figure 5:
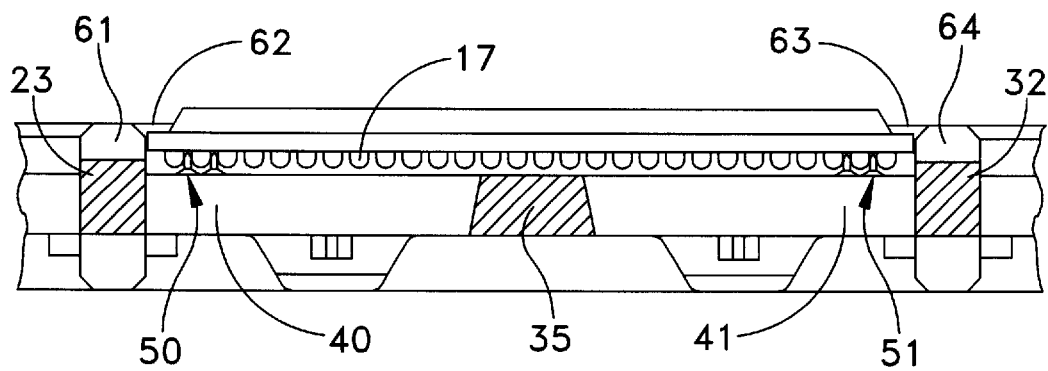
FIG. 5 is a cross-sectional view along lines 5—5 in FIG. 3.

FIG. 5 depicts the tray 20, specifically the storage pocket area 30, oriented to receive the BGA integrated circuit 10 in a terminals down position. From this cross-section it will be seen that column structures 50 and 51 extend upwardly by a distance that exceeds the depth of the terminals. This spaces the terminals 17 in FIG. 1 from any supporting structure in the storage pocket, such as the arms 36 through 39 in FIG. 3. Moreover, the lateral spacing of the individual columns in the column structures 50 and 51 matches the pitch of the terminals 17 thereby to engage the terminal surface 15 intermediate the terminals 17.

In many situations the trays 20 are constructed with tolerances that are more strict than those of the BGA integrated circuits 10. Consequently, it is possible for an individual column to align with a portion of a terminal. However, the columns are thin. Over a vertical distance corresponding to the height of the terminals 17, the columns have a diameter that is less than that of the terminals 17. In addition, a BGA integrated circuit will generally have sufficient peripheral spacing between its edges and the surrounding tray structure to displace by one-half the pitch of the terminals. However, the tolerance for the pitch of the individual terminals is very close. Consequently if any contact were to exist between one or more columns and terminals, the BGA integrated circuit will shift within the storage pocket area. In a final position all of the individual columns will rest on the surface 15 between proximate terminals 17.

Figure 6:
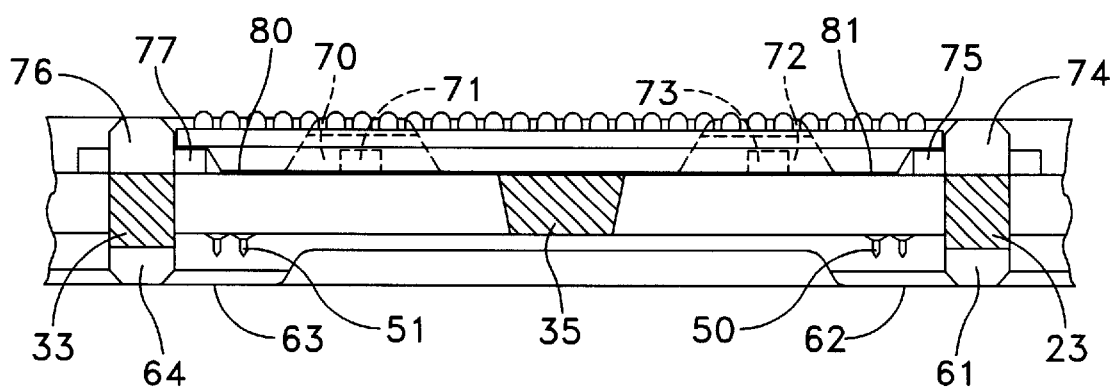
FIG. 6 is an inverted cross-sectional view of the storage pocket area shown in FIG. 5.

FIGS. 5 and 6 also depict peripheral wall structures 61 and 62 adjacent the platform 40 and wall structures 63 and 64 adjacent the platform 41. These wall structures extend beyond the edges of a ball grid array integrated circuit and thereby provide stability in a transverse position; that is, they prevent any significant horizontal movement in the orientation shown in FIG. 5. Thus, this side of the storage pocket 30 provides stable support and positioning for a BGA integrated circuit component in a terminals down orientation. Further, the column structures provide a means of providing vertical support particularly for fully populated BGA integrated circuits in which the array of terminals covers the entire face of the BGA integrated circuit because the column structures eliminate any need to engage end portions of the terminal side. Further, the thin column structures minimize the potential for terminal damage when the BGA integrated circuit is stored in the storage pocket area 30A in the terminals down position as shown in FIG. 5.

Like the tray shown in U.S. Pat. No. 5,400,904, it is desirable that the trays be useful in an inverted or reverse position for carrying the BGA integrated circuit 10 in a terminals up position. FIG. 6 depicts the integrated circuit tray 20 in such a position with the column structures 51 and 50 extending downwardly. In this orientation the corner wall extensions 61 through 64 also extend downwardly below the transverse structure 35. Intermediate wall structure 70 extends upwardly from the storage pocket 30 and carries an inwardly extending tab 71. Likewise a similar wall structure 72 carries inwardly extending tab 73. FIG. 6 also depicts another wall structure 74 with a tab 75 and wall structure 76 with a tab structure 77.

In this orientation the storage pocket 30 receives the BGA integrated circuit 10 in a terminals up orientation. The tabs 71, 73, 75 and 77 and similar tabs on other wall portions engage and support the surface 19 of the BGA integrated circuit 10. The wall portions 70, 72, 74 and 76 extend beyond the edges of the BGA integrated circuit 10, such as the edges 11 through 14 in FIG. 1A, thereby to provide horizontal stability for the BGA integrated circuit 10 in this orientation.

As will be apparent and as is disclosed in our foregoing U.S. Pat. No. 5,400,904, when individual trays 20 are stacked, the intermediate walls, such as intermediate walls 70 and 72, extend into recesses between the end wall extensions 60, 61, 62 and 63 whereby one or the other or both of the interfitting wall portions continuously define the periphery of the storage pocket in any orientation of stacked trays.

Figure 7:
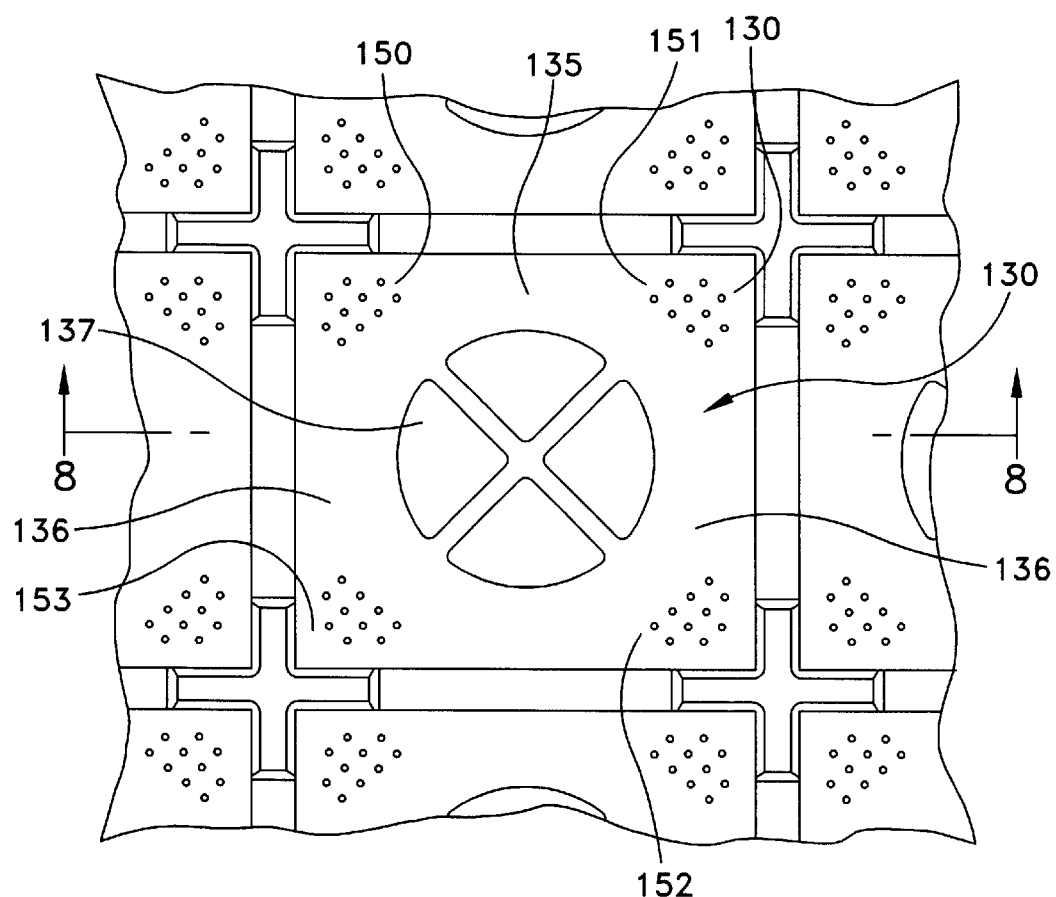
FIG. 7 is a plan view of an alternate structure for a storage pocket area.
Figure 8:
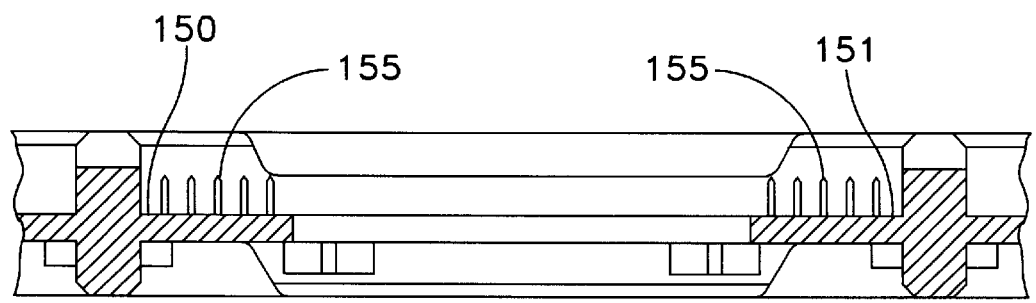
FIG. 8 is a cross-sectional view taken along lines 8—8 in FIG. 7.

FIG. 7 depicts an alternative storage pocket area structure for a storage pocket 130 that is similar in peripheral structure to the storage pocket 30. In this case a horizontal or transverse structure 135 contains a plate 136 across and the storage pocket 130. Four sector-shaped openings 137 are formed in the plate to reduce weight and improve thermal stability. In this embodiment the plate 136 supports column structures 150, 151, 152 and 153, and each column structure includes ten thin tapered columns, such as the tapered column 155 shown in FIG. 7. Again, such structures can be integrally molded in a tray. Thus FIGS. 4 and 7 depict two of many column structures that could be incorporated in this invention.

In summary, a BGA integrated circuit tray 20 having either of a storage pocket 30 as shown in FIGS. 3 through 6 or a storage pocket 130 as shown in FIG. 7, provides one or more storage pockets that can carry a BGA integrated circuit in either a terminals up or terminals down position depending upon the orientation of the integrated circuit tray 20. In the orientation shown in FIGS. 2 and 5, the integrated circuit tray 20 carries the BGA integrated circuit 10 in a terminals down position. When the tray 20 is flipped so the storage pocket has the orientation shown in FIG. 6, the tray 20 carries the BGA integrated circuit in a terminals up position. In the terminals down position, the tray provides stability in both vertical and horizontal directions and minimizes any possibility of damage. The use of the column structures of this invention also provides stable, vertical and horizontal support with the vertical supports being spaced inwardly from the peripheral edges of the BGA integrated circuit. This provides a reliable support even when the individual terminal balls reach the periphery of the BGA integrated circuit package and even in view of the typical tolerances that can be seen between individual BGA integrated circuits.

This invention has been disclosed in terms of two specific embodiments for BGA integrated circuit of a particular size. It will be apparent that various variations can be made to accommodate BGA integrated circuits of different sizes. Moreover, examination of FIGS. 5 and 7 will indicate that any number of structures could be incorporated within a storage pocket to provide the columnar structure support of this invention. Therefore, it is the intent of the appended claims to cover all such variations and modifications as come within the true spirit and scope of this invention.

What is claimed as new and desired to be secured by Letters Patent of the United States is:

1. A tray for ball grid array integrated circuit components characterized by having a planar terminal surface populated with spaced terminals, said tray having a storage pocket area for receiving a ball grid array integrated circuit component, said storage pocket area comprising:

A) a structure extending transversely across the storage pocket area, and

B) a plurality of spaced clusters of columnar supports at spaced positions on from said transversely extending structure, each said cluster comprising closely spaced columnar supports having a circular cross-section and extending normally from said transversely extending structure to coplanar free ends thereof, the spacing of said columnar supports within a said cluster corresponding to the terminal spacing on the integrated circuit component to be located thereon whereby the free ends of said columnar supports engage the terminal surface intermediate the terminals and support the ball grid array integrated circuit within the storage pocket area.

2. A tray as recited in claim 1 wherein the terminals on the ball grid array integrated circuit have a predetermined pitch and said plurality of columnar supports located at positions having a corresponding spacing.

3. A tray as recited in claim 2 wherein each said columnar support has a base portion at said transverse structure and a tapered column extending from said base portion to the free end of said column structure.

4. A tray as recited in claim 2 wherein each of said columnar supports is thin adjacent the free end thereof.

5. A tray as recited in claim 4 wherein each said columnar support has a base portion at said transverse structure and a tapered column extending from said base portion to the free end of said columnar support.

6. A tray as recited in claim 1 wherein said transverse structure forms coplanar platforms at each corner of the storage pocket area and wherein each platform carries a plurality of said columnar supports.

7. A tray as recited in claim 6 wherein each storage pocket additional comprises spaced walls that extend to free edges beyond the said columnar support plane thereby to stabilize the location of the ball grid array integrated circuit within the storage pocket area in a direction parallel to the transverse support structure.

8. A tray for receiving a plurality of ball grid array integrated circuit components, each ball grid array integrated circuit having a planar terminal side populated with a plurality of terminals having a predetermined pitch, said tray comprising:

A) a framework that defines a plurality of storage pockets, each storage pocket being adapted to receive one ball grid array integrated circuit component, B) a plurality of platforms at spaced locations within each storage pocket and attached to said framework, C) a plurality of spaced thin circular column structures extending from each spaced platform terminating in coplanar free ends, the spacing of said column structures at a spaced platform corresponding to the predetermined pitch of the ball grid array integrated circuit whereby said free ends define a support plane and engage the terminal side of the ball grid array integrated circuit when the ball grid array integrated circuit is inserted into the storage pocket area in a terminals down position, D) support mean disposed in said storage pocket on the opposite side of said platforms for defining a second support plane that engages another surface of a ball grid array integrated circuit whereby said tray is flippable to a second orientation for storing the ball grid array integrated circuit component in a terminals up position.

9. A tray as recited in claim 8 wherein each of the column structures has a height greater than the depth of the terminals whereby the terminals are spaced above the plane of said platforms.

10. A tray as recited in claim 9 wherein each column structure comprises a tapered column extending from a corresponding one of said platforms.

11. A tray as recited in claim 9 wherein each column structure comprises a conical base at a corresponding platform and a tapered column extending from said conical base to the free ends.

12. A tray as recited in claim 9 wherein each of said platforms comprises a portion of a diagonal arm that spans said storage pocket.

13. A tray as recited in claim 12 wherein said storage pocket has a rectangular shape and includes a pair of said diagonal arms thereby to locate a platform proximate each corner of said storage pocket.

14. A tray as recited in claim 13 wherein each column structure comprises a conical base at a corresponding corner platform and a tapered column extending from said conical base to a free end at the support plane.

15. A tray as recited in claim 9 wherein each said platform is formed as a portion of a thin planar member that spans said storage pocket.

16. A tray as recited in claim 15 wherein said storage pocket has a rectangular shape and includes a pair of said diagonal arms thereby to locate a platform proximate each corner of said storage pocket.

17. A tray as recited in claim 16 wherein each column structure comprises a tapered column extending from said platform to a free end at the support plane.

18. A tray as recited in claim 8 wherein said support means includes means for engaging the other surface of a ball grid array integrated circuit adjacent the edges thereof.

* * * * *